United States Patent
Tighe

[11] Patent Number: 6,045,396
[45] Date of Patent: Apr. 4, 2000

[54] FLEX CABLE CONNECTOR FOR CRYOGENIC APPLICATION

[75] Inventor: Thomas S. Tighe, Pasadena, Calif.

[73] Assignee: TRW Inc., Redondo Beach, Calif.

[21] Appl. No.: 08/928,198

[22] Filed: Sep. 12, 1997

[51] Int. Cl.[7] .................................................. H01R 9/07
[52] U.S. Cl. ............................................ 439/493; 439/67
[58] Field of Search ........................... 439/492, 493, 439/494, 495, 496, 497, 498, 499, 59, 60, 61, 62, 65, 66, 67, 69, 72, 73, 74

[56] References Cited

U.S. PATENT DOCUMENTS

| | | |
|---|---|---|
| 4,538,865 | 9/1985 | Wakabayashi . |
| 4,614,393 | 9/1986 | Laskaris ................................. 339/95 |
| 5,329,261 | 7/1994 | Murdock et al. . |
| 5,371,324 | 12/1994 | Kanno et al. . |
| 5,484,295 | 1/1996 | Mowry et al. ............................ 439/66 |
| 5,613,861 | 3/1997 | Smith et al. . |
| 5,730,619 | 3/1998 | Hamlin ................................... 439/493 |
| 5,741,148 | 4/1998 | Biernath ................................. 439/284 |
| 5,752,851 | 5/1998 | Zaderej et al. .......................... 439/493 |

*Primary Examiner*—Lincoln Donovan
*Attorney, Agent, or Firm*—Michael S. Yatsko; Ronald M. Goldman

[57] ABSTRACT

A new electrical cryogenic connector system employs two printed circuit board type mating connectors (1 & 3), each containing a plurality of plated-on metal lines (5 & 6) running along the respective circuit boards in parallel, with the plated-on metal lines on at least one of the connectors being of Beryllium Copper material. The ends of the series of Beryllium Copper lines on one of the complementary circuit boards is formed into a pointed spring finger that is pointed toward the opposed circuit board. With the two boards sandwiched and pressed together with their plated on metal lines directly in line with and facing one another, the spring fingers compress and, under the spring force created by that compression, the spring fingers engage and maintain positive electrical contact with the corresponding conductor traces on the opposed circuit board. Ancillary to the described connector, a new method for constructing an electrical connector is also presented.

11 Claims, 4 Drawing Sheets

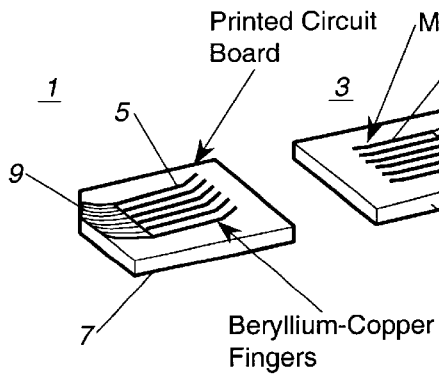
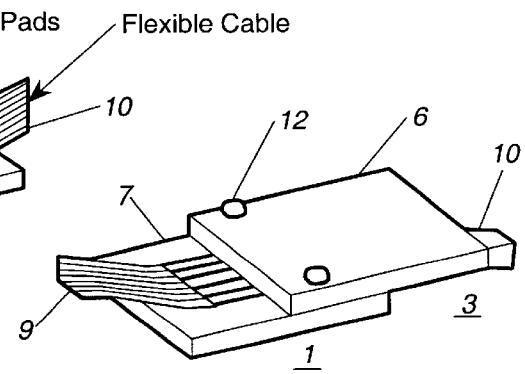
Figure 1
Figure 2
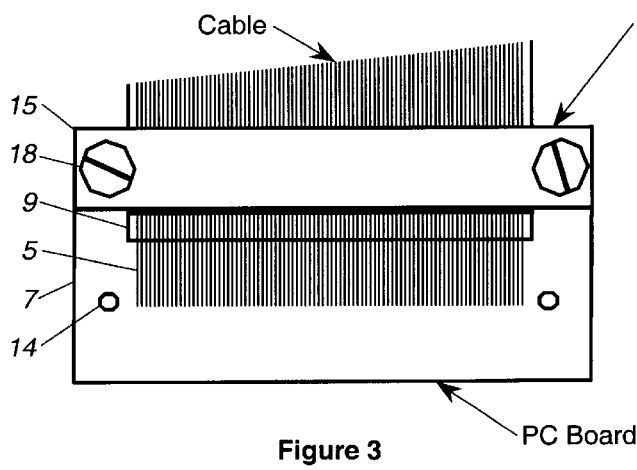
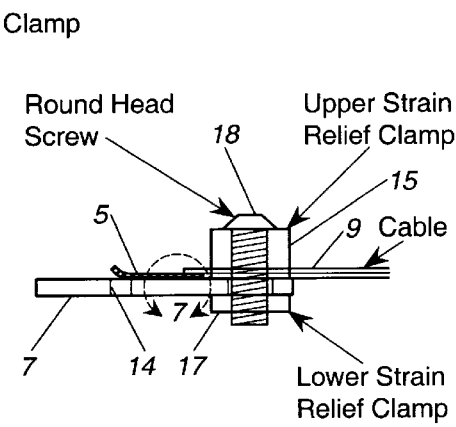
Figure 3
Figure 4
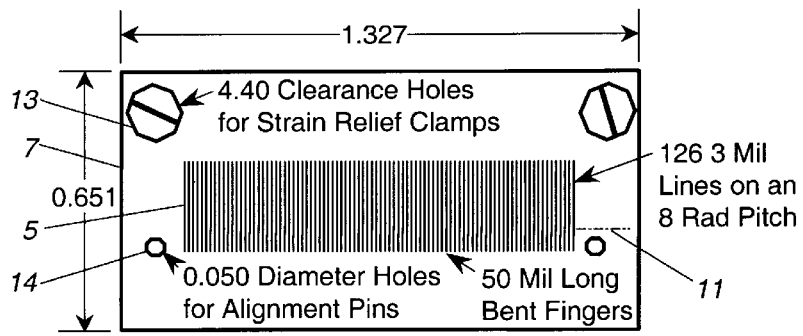
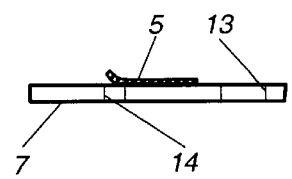
Figure 5
Figure 6

Components

Components brought together; fingers still bent

Assembly clamped together with alignment pins; fingers flattened out

Assembly clamped together with alignment pins; fingers flattened out

FLEX CABLE CONNECTOR FOR CRYOGENIC APPLICATION

STATEMENT OF GOVERNMENT SUPPORT

This invention was conceived during the course of Contract or Subcontract No. ATSP FQ406-95-D-0069, D.O. 0015 for the Department of Defense. The government has certain rights in this invention.

FIELD OF THE INVENTION

This invention relates to electrical connectors, and, more particularly, to a flex cable connector system useful in cryogenic environments.

BACKGROUND

A number of companies, such as IBM and Packard-Hughes, produce high density flexible electrical cables, often referred to as "flex cable", for use in routing electronic data. These cables have the capability of routing data at high rates of up to Gigabits per second. The cable is relatively flat and resembles a thick stiff belt in appearance and it may be bent around corners or wrapped, much like an ordinary leather belt. The flex cables pack a large number of separate insulated electrical lines within the flex cable's limited width, typically at a line density greater than eighty signal lines per inch. In its construction, the flex cables employ a polyimide film, a strong flexible plastic insulating material, as the dielectric substrate and outer insulating wrap. The electrical lines are lithographically defined and are formed of a very thin and narrow metal strips upon the dielectric substrate and a covering layer of the same material is laminated to that substrate covering the metal strips.

The foregoing flex cables may be designed to have low thermal conductivity, a characteristic which makes the cable ideal for cryogenic applications. The cables can be used to connect cryogenic electronics apparatus, superconducting electronic apparatus, cryo-CMOS circuits and cooled GaAs amplifiers, which a cryogenic refrigeration system maintains at very low cryogenic temperatures during operation, to other external electronic components and circuits that are maintained at room temperature. Since the cable doesn't conduct significant external heat to the cryogenic apparatus, the cable does not create an undue heat load on the cryogenic refrigeration system.

For expeditious cable connection and/or disconnection, electrical connectors are employed with the cable. Respective lengths of cable are wired into respective electrical connectors and the lengths of cable are interconnected by connecting the two mating electrical connectors together, as is conventional practice in the electronic field.

As is elementary, an electrical connector contains a sufficient number of spaced electrical contacts, enabling each connector contact to be electrically connected to a respective electrical lead in the cable. A cable to cable connection is made by mating two connectors or connector portions, as variously termed, together, to form the connector system or connection, and bridging the multiple electrical paths from one cable to another through the connector contacts. To avoid possible confusion in this description, it is appropriate to remind the reader that each mating half or portion of a connector is customarily also referred to as a connector. When reference is made to connector, thus, the reader should be certain to understand the context in which the reference is made to understand whether reference is being made to a connector portion or to the connector system.

The electrical connectors used by the afore-recited flex cable manufacturers to connect flex cables together or to connect flex cables to rigid printed circuit boards employ a "pressed contact" arrangement. The pressed contact arrangement is not the typical male-female prong and socket contact arrangement found in conventional electrical connectors, in which a prong contact frictionally engages within a socket contact. Instead, in the situation in which two flex cables are to be joined, two substantially identical relatively planar thick rigid printed circuit boards, containing the requisite number of electrical lines formed slightly protruding above the circuit board's planar surface serve as the mating connectors. And, in the situation in which a flex cable is to be connected to a printed circuit board, the flex cable and the rigid printed circuit board, containing the requisite number of electrical lines protruding slightly above the planar surface of the circuit board, serve as the mating connectors.

As those skilled in the art appreciate, for a cable to cable connection, the electrical lines plated upon each of those circuit boards is aligned and soldered or otherwise joined to corresponding electrical leads at an end of an associated flex cable, typically by conventional soldering techniques. One of the circuit boards in the connector is inverted relative to the other and, with the electrical lines on the circuit boards aligned, the boards are pressed into engagement to place the respective lines in electrical contact and form the electrical connection. To complete the connector, a mechanical fastening system, including alignment pins and a pressure pad of elastomeric material clamps the mated connector portions together and maintains the respective parallel conductors in contact under a positive pressure or force. The surface of pressure pad contains a series of minute elastic rubber-like bumps or fingers to press against the top of one of the circuit boards, providing, thus, the pressed contact arrangement.

Although the foregoing connector design serves well at room temperature, at cryogenic temperature the connector, and, particularly, the connector's elastomeric pad, often fails to function properly. At cryogenic temperature, the elastomeric material forming the pressure pads becomes brittle and loses its ability to maintain adequate pressure on the circuit boards. As example, where the connector connects eighty or so electrical lines in a high density flex cable, should any one of those electrical lines fail to connect through the connector to an associated line, the connector is deemed to have failed. The loss of any electrical path through the connector cannot be tolerated. Thus, although available flex cable is ideal for application in cryogenic devices, presently available connectors for those flex cables are unsuited for use at those very low temperatures.

When the foregoing connector fails, it must be replaced. To do so requires the cable to be disconnected from the old structure and reattached and soldered to the replacement or requires a new cable to be attached and soldered. In addition to requiring new connectors, that procedure also requires considerable time and expense.

An object of the present invention, therefore, is to provide a new connector system for flex cable that functions at cryogenic temperatures.

A further object of the invention is to provide a connector system that may be easily repaired or reconstructed, without requiring cable rewiring anew, should the connector system fail.

Another object of the invention is to provide a connector system that adapts flex cables to cryogenic device application and may be used in cryogenic systems.

And a still further object of the invention is to provide a positive pressure contact type connector that does not incorporate elastomeric material or any other material that becomes brittle or disfunctional at cryogenic temperatures.

SUMMARY OF THE INVENTION

In accordance with the foregoing objects, the present invention employs two printed circuit board type connector components or connectors. One of those printed circuit board elements contains a plurality of plated-on bare Beryllium Copper lines that extend along the board alongside one another in parallel, and serve as the connector's contacts. The second printed circuit board contains a like plurality of plated-on metal lines similarly extending alongside one another. An end portion of the Beryllium Copper lines is detached from the board's surface and permanently deformed or shaped into a concave curve, that curves outwardly from the board surface. Due to the nature of Beryllium Copper, the curved portions are resilient and form electrically conductive spring fingers. Preferably, the end edge of each spring finger is pointed.

With the boards facing one another, aligned, and squeezed together, the spring fingers on the one circuit board are compressed and press against a corresponding metal line on the other printed circuit board to complete an electrical path through the connector. Even at cryogenic temperatures, the is spring tension in the compressed springs ensures positive electrical contact between each pair of lines in the connector's mating halves. In repeated use, the connector is not adversely affected by continued recycling between cryogenic temperatures and room temperatures.

A novel process to fabricate the connectors, particularly to construction of the spring fingers, is also described. That process includes plating the rows of conductors on the printed circuit board, cutting end portions of those conductors away from the circuit board to free the end portions, bending those end portions over a cylindrical mandrel to permanently deform those end portions into a curved shape with spring like characteristics, and pressing the deformed ends down against the circuit board to define the final curved shape to the spring fingers.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

BRIEF DESCRIPTION OF THE DRAWINGS

In the drawings:

FIG. 1 is a general pictorial view of the an embodiment of the connector system containing the mating connectors;

FIG. 2 is a general pictorial view of the connector system assembled;

FIG. 3 is a more detailed top plan view of one connector of the connector system, drawn to a larger scale;

FIG. 4 is a side view of the embodiment of FIG. 3;

FIG. 5 illustrates a portion of the elements of the embodiment of FIGS. 3 and 4 in top plan view and FIG. 6 illustrates FIG. 5 in side view;

DETAILED DESCRIPTION OF THE PREFERRED EMBODIMENTS

Figure 7:
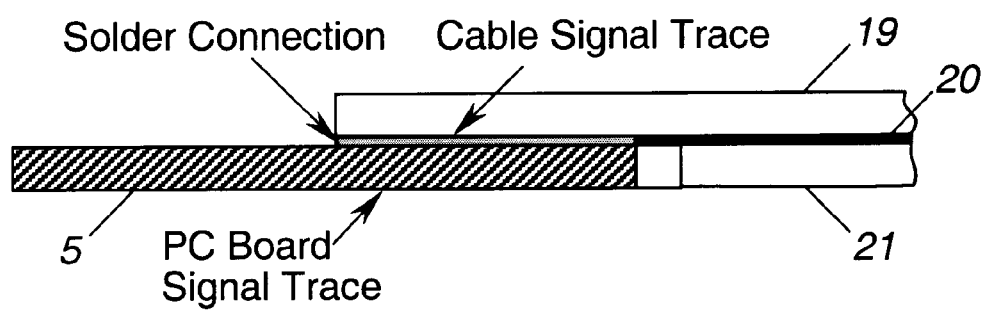
FIG. 7 is a partial section view taken along the lines 7—7 in FIG. 4 and drawn to a larger scale.

Reference is made to FIGS. 1 and 2, which pictorially illustrate in minimal detail the principal elements of the disclosed electrical connector or, as variously termed, electrical connector system, as used to form a cable to cable connection. Referring first to FIG. 1, the connector system contains two connector portions, a male connector 1, to the left, and a female connector 3 to the right. The male connector contains multiple parallel Beryllium Copper traces, lines, or, as variously termed, contacts 5, located spaced apart, attached to, or more accurately, plated upon the upper surface of a relatively rigid printed circuit board 7. The circuit board is formed of standard insulating material, is an electrical insulator, and is at least semi-rigid physically.

As generally illustrated the ends of each Beryllium Copper contact is detached from the board and is of a curved shape that curves upwardly from the circuit board's surface. Importantly, such free end possesses a spring like characteristic. The opposite end of the parallel conductor arrangement, which remains connected to the circuit board, is connected to corresponding metal lines or conductors in a flex cable 9, partially illustrated.

The mating connector 3 contains the series of metal conductors 6 plated on the surface of a like constructed printed circuit board 8; and the ends of those conductors are connected to corresponding conductors in another flex cable 10, partially illustrated. However, in this mating connector, the entire length of conductors 6 lie flat on the upper surface of the supporting circuit board 8. Conductors 6 may be any electrically conductive metal such as copper, tin, gold, gold-plated copper, aluminum or, if desired, Beryllium Copper.

When the connectors are to be mated, as shown in FIG. 2, the printed circuit boards 1 and 3 are placed one atop the other, with printed circuit board 6 inverted so that the bare conductors on the two circuit boards directly face one another, and the two circuit boards are fastened together in that relationship by suitable fastening means, only generally represented in this figure by bolts 12. It is appreciated, that, when assembled together as illustrated in FIG. 2, the completed connector serves to provide an electrical path through the connector for each of the electrical lines in the associated cables.

The foregoing pictorial illustrations serve to generally introduce the new connector structure and illustrate its general design principle using a limited number of electrical contacts and with limited construction details. A more complete detailed illustration of a practical embodiment of the invention is provided in the succeeding drawing figures, which are next considered. For convenience in the following figures, the same number designation is given to an element that corresponds to an element previously identified in FIGS. 1 and 2.

A more detailed view of the male connector 1 is illustrated to a different scale in top plan view in FIG. 3 and in side view in FIG. 4 to which reference is made. Circuit board 7 is wide enough to accommodate the number of contacts 5 carried on its surface. A rectangular shaped metal stress relief clamp component on the upper side and a complementary rectangular shaped metal stress relief clamp 17, on the underside, are joined by a pair of threaded bolts 18. The bolts fit through bolt passages or holes formed in the upper clamp, and on the outer edges of the circuit board and extend into threaded holes in the mating relief claim 17.

With the respective bolts screwed into clamp member 17 and tightened, the relief clamps compress and hold an end portion of flex cable 9, leaving an end portion of the flex cable, containing the formed spring fingers, exposed at the front end of the clamp. A pair of circular passages 14 are located along the left and right edges of the circuit board. Those passages form alignment holes, which are used when assembling the male connector to it mating female connector as later herein described in connection with FIGS. 8–10. The outwardly curved end or spring finger that forms an extension to each of the conductors is more visible in the side view of FIG. 4.

The basic component of the connector of FIG. 3 is illustrated in FIG. 5 in top plan view and in FIG. 6 in side section view to which reference is made. The two passages 13 for bolts 18 are visible in this figure. The conductors 5 are formed in parallel and occupy a portion of the upper surface of circuit board 7, protruding slightly above the circuit boards insulating surface. The bond between the conductors 5 and the surface of the circuit board is broken at the front end of the conductors and extends rearward a short distance, about to the position of dash line 11. The detached portions or, as variously termed, free ends are permanently deformed into a curve as illustrated in FIG. 6, forming spring fingers. The tip ends of those spring fingers, preferably, each come to a point.

Returning to FIG. 3, flex cable 9, partially illustrated, is a typical high density cable. It suitably contains 128 parallel electrical lines or, as variously termed, signal traces 20 that are of three mils line width on an eight mil pitch laminated between thin layers 19 and 21 of polyimide. The corresponding relatively rigid circuit board 7 contains a like number of lines or traces 5 of like width and pitch. To give a better feel to the small sizes possible for the connector invention, it is noted that in a practical embodiment of the connector of FIGS. 3 and 4, the width of the connector, along the width of the figure, is about 1.33 inches, and the height or length of the connector, along the vertical direction in the figure is about 0.7 inches.

The cable is attached to the printed circuit board and the individual leads are connected to associated electrical leads on that circuit board. That attachment is accomplished by conventional soldering technique. As illustrated in the enlarged partial side view of FIG. 7, which is taken along line 7—7 in FIG. 4, flex cable 9 contains outer insulating layers 19 and 21 with the electrical conductors 20 sandwiched and laminated in between. A short length of the underside covering polyimide layer 21 is removed from an end of the cable to expose the electrical leads 20, the upper covering layer 19 remaining unchanged. The exposed electrical leads 20 are then aligned with the corresponding electrical leads 5 on the circuit board; and solder is applied to mechanically and electrically join leads 5 and lines 20 together.

The mating female connector contains the same elements, located in the same orientation, having the same relationship and is fabricated in the same way as the male connector, except that its plated-on connector conductors lie entirely flat on the supporting circuit board, such as was generally illustrated at 6 in FIG. 1, and do not form spring fingers. Hence the view of the mating connector is the same as presented in FIGS. 3 and 4, with the exception that the end of the supported conductors do not curve upward, as does conductor 5, but lies flat on the circuit board. Accordingly, the structure of the mating female connector need not be separately illustrated.

Figure 8:
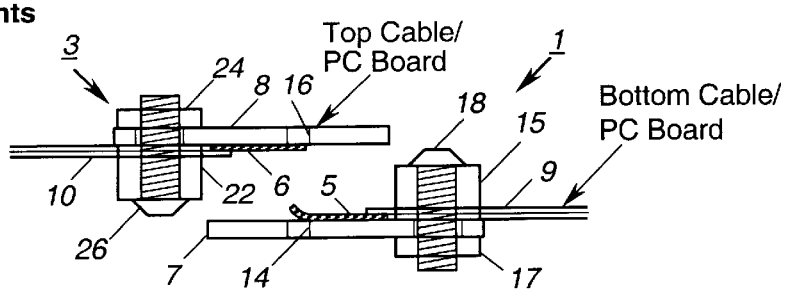
FIGS. 8, 9 and 10 illustrate both mating connectors in side view; the additional clamping elements to form a connector system, and the relationship of the two mating connectors as assembled into a cable to cable connector system.
Figure 9:
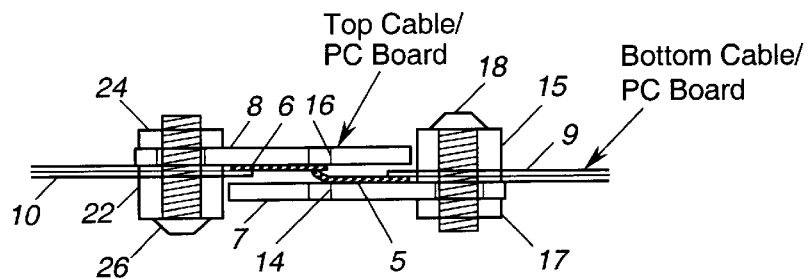
Figure 10:
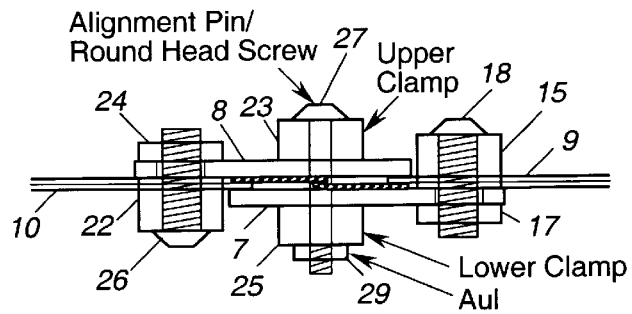

The described connector components are assembled together to complete a connection as illustrated in the side assembly views presented in FIGS. 8, 9 and 10 to which reference is made. The female connector 3 includes a strain relief bar 22, which corresponds to relief bar 15, a second relief bar 24, which corresponds to relief bar 17, and a pair of bolts 26, corresponding to the pair of bolts 18 in the male connector 1. It also includes a corresponding pair of alignment passages 16. As shown in FIG. 8, the connector components 1 and 3, previously assembled to respective cables 9 and 10, are arranged one over the other with the alignment holes 14 underlying the corresponding alignment holes 16 in female connector 3. As shown in FIG. 9, connector 3 is brought into contact with connector 1 so that the conductive spring fingers at the tip end of conductor s 5 of connector 1 contact the corresponding conductors 6 on circuit board 8, and commences to compress those spring fingers against conductors 6. When completed the spring fingers are almost flattened, as illustrated in FIG. 10, but retain their resiliency and exert a positive reactionary force ensuring good contact pressure.

To hold the elements in the foregoing mating relationship and complete the connector a fastening structure is used that clamps the mating connectors together. That clamping force also maintains the spring contacts under a positive pressure or force. Such a clamp is formed with upper and lower clamping bars 23 and 25, and a pair of bolts 27 and nuts 29, one from each of the pair being located on opposite ends of the clamping bars. Each of the clamp bars is of a straight narrow flat rectangular box shape, as illustrated in end view in the figure, and is of a length that extends across the width of the connector.

Upper and lower clamp bars 23 and 25 are placed in contact with the respective rear surfaces of the circuit boards of connectors 3 and 1, respectively, with the alignment or bolt holes in the clamping bars placed in alignment with the corresponding alignment holes 14 and 16 in each of those circuit boards. Bolts 27, only one of which is illustrated, are inserted through the holes and are fastened in place with nuts 29, only one of which is illustrated. The fastened bolts thereby maintain the components in the illustrated sandwiched relationship. The bolts and nuts exert force on the adjacent clamping bars, and the bars distribute such clamping force across the entire underlying surface.

Preferably a portion of the bolt's shank leading from the bolt head is left unthreaded, leaving a smooth cylindrical surface of a diameter just small enough to clear the cylindrical walls of the alignment holes in the circuit boards and interposer. The foregoing structural feature allows the fastening bolt to serve also the function of an alignment pin that ensures that the parts remain in the desired alignment through final assembly.

The foregoing embodiment was of a cable to cable connection. It is appreciated that the connector also may be used for a cable to circuit board connection. In such an alternative, the circuit board that served as a base to a mating connector, such as circuit boards 7 or 8 is not connected to a flex cable, but instead constitutes a portion of the circuit board of a particular electronic apparatus. That is, the circuit boards connector conductors are applied to an edge region of the apparatus's circuit board, and the rear end of those conductors are routed by means of other plated on metal conductors to the various circuit elements found on the board, which is in lieu of a flex cable connection to those elements.

Figure 11:
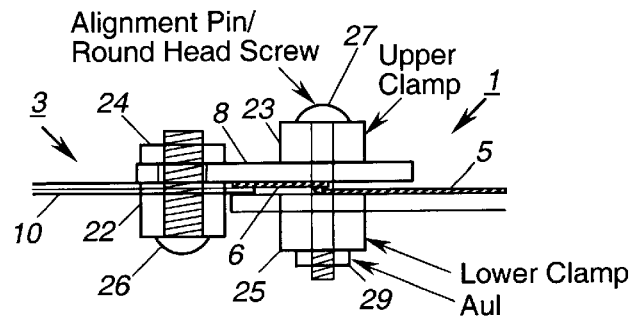
FIG. 11 illustrates a cable to circuit board embodiment of the connector system.

Such an alternative embodiment is illustrated in side view in FIG. 11 showing the connector system with the two connectors assembled together. In as much as most of the elements of the alternative connector system are identical to the corresponding elements in the prior embodiment, and, some, though not physically identically are functionally identical to corresponding elements in the prior embodiment, the corresponding elements of this embodiment are denominated in the figure by the same number used for the element in the prior embodiment and primed. It is appreciated that the description of the elements for this embodiment is the same as that already given with respect to the prior embodiment, which need not be repeated.

In this embodiment, the female connector 3' is of the same construction illustrated in FIGS. 8, 9 and 10. However, the male connector 1' is formed on an edge of the equipment's printed circuit board 7', which substitutes for the circuit board 7 in the prior embodiment. That equipment circuit board contains appropriate alignment holes. And the associated clamping device 23', 25', 27' and 29', is the same as in the connector structure earlier described. Since the male connector does not attach to a cable, the cable strain relief elements used in the embodiment of FIGS. 8–10 are not necessary. The spring finger ends to Beryllium Copper conductors 5' are illustrated in FIG. 11 in the compressed condition. Prior to final assembly, those spring fingers appear the same as the corresponding spring fingers of conductor 5 in each of FIGS. 8 and 9.

Figure 12:
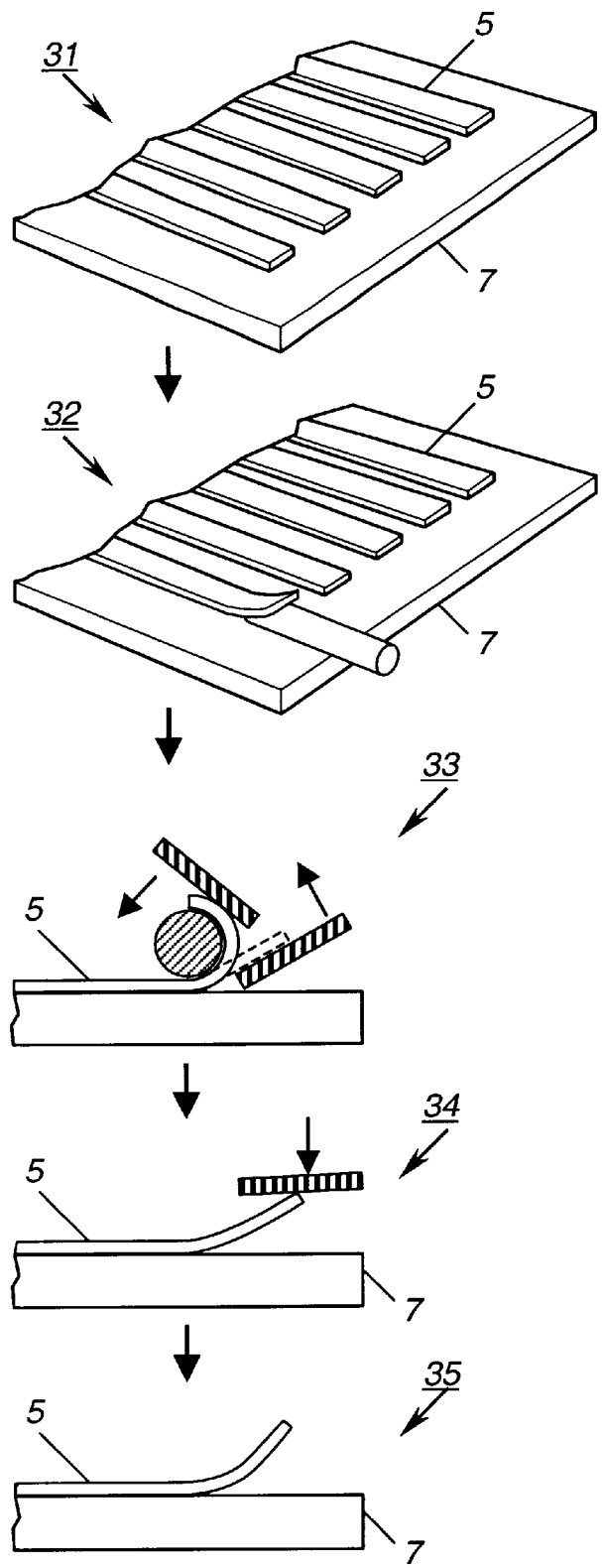
FIG. 12 illustrates the process of forming the spring fingers.

The procedure to fabricate the spring fingers was earlier only briefly described. Considering that procedure in greater detail and referring as necessary to FIG. 12 illustrating the steps, the procedure starts with standard printed circuit board material, as example that known as FR-4 containing a plated on layer, suitably two mils thick, of full hard Beryllium Copper sheet. Beryllium Copper is a known alloy containing both metal elements homogenously mixed and known to be a good electrical conductor, not the best, is hard and durable and is known to be useful for manufacture of spring fingers. The material has been proposed for use in various electrical devices including electrical connectors, where its physical and electrical characteristics best serve the needs of the electrical device.

The foregoing plated circuit board is then treated to form the lengths of conductor desired for conductors 5, suitably by a conventional subtractive etching process known in the industry. In this the Beryllium Copper surface is coated with photoresist and exposed photographically to a negative image of the desired conductors ultimately desired, including, preferably a pointed end to those conductors, the unexposed photoresist is chemically removed, exposing the unwanted metal portions, and board is placed in a chemical etchant bath, suitably Ferric Choride, to etch away the unwanted metal. Thereafter the cured photoresist is removed, leaving the formed conductors 5 as generally illustrated at 31.

The bond between conductors 5 and circuit board 7 is then manually broken, suitably by carefully cutting into the board under the tip ends of the conductors, one by one, with a sharp Exacto knife or equivalent, a somewhat labor intensive step, illustrated at 32. This procedure releases a small portion of the length of conductor 5, freeing the ends. Then a long cylindrical mandrel is placed atop and transverse the conductors 5 a short distance from the conductor's tip end at the location where the bend is to be formed.

With the mandrel held in place, a straight flat stiff metal forming bar is slipped underneath the tip ends of the conductors. The forming bar is rotated to scoop up all the tip ends and then press them against the cylindrical mandrel, exceeding the elastic limit to the material, as at 33. This permanently deforms the shape of the free ends and produces the initial bend in the conductor's free ends.

Next, the mandrel and forming bar are removed. With that some spring-back occurs, but the Beryllium Copper strips remain permanently deformed. The forming bar is reapplied to the free ends of the conductors and is pressed down, as at 34, and then released. This latter step defines the final curved shape of the conductor's free ends, the spring fingers, as represented at 35.

The connector remains effective at cryogenic temperatures. When cooled all of the metal parts contract with temperature as would enhance firm electrical contact between the elements. When the equipment is to be disengaged and removed, the cryogenic temperatures are removed and the unit is brought back to room temperature. The connector is easily disassembled by unfastening the nut, removing the clamping structure and detaching the component elements, in essentially a reverse procedure to that earlier described in connection with assembly in FIGS. 8 through 10. It is found that the spring fingers retain their springiness even after cycling through cryogenic temperatures and back and that the connector elements may then be reused.

The connector system is a simple structural and may be constructed almost entirely by automated fabrication equipment, making the system relatively inexpensive. Instead of requiring substitution of a new connector and the attendant labor of rewiring a new connector to the cable, great savings in both time and effort are thereby achieved.

As those skilled in the art appreciate, many modifications to the foregoing structure are permissible without departing from the scope of the present invention. The foregoing embodiments used contacts that are pointed in shape. However, as those skilled in the art understand from reading this specification, the connector invention is not so limited. Other shapes, though less preferable, may be substituted, and achieve some benefit of the invention. Additionally, the preferred embodiment has been illustrated in connection with connectors having very fine traces and using very minute sized contacts as exist for a particular cryogenic application known to the inventors, which gave rise to the problem solved by the disclosed connector. However, it is recognized that the disclosed connector structure may be adapted to larger or smaller size metal traces in the same or for different applications and may find application in other fields for related reasons.

Lastly, the Beryllium Copper spring contacts for the embodiment were fabricated using a particular process that used a cutting tool. Other fabrication processes might hereafter become available that can be substituted.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. An electrical cryogenic connector for a flex cable comprising:
   a first base of electrically insulative material having a plurality of spaced Beryllium Copper conductors attached to and protruding above a first surface of said base, said Beryllium Copper conductors being oriented in parallel;
   a second base of electrically insulative material having a plurality of spaced metal conductors attached to and protruding above a first surface of said second base, said metal conductors being oriented in parallel;
   said Beryllium Copper conductors on said first base having an end portion detached from said base and configured in a curved geometry that curves outwardly from said first surface of said first base to define a spring finger;
   said first and second bases being oriented with said conductors directly facing one another, with each said conductor on one of said bases aligned in parallel with a corresponding one of said conductors on the other of said bases; and
   fastening means for fastening said first and second bases in sandwiched relationship to compress said spring fingers, wherein said spring fingers engage a corresponding one of said plurality of metal conductors on said second base and maintains a positive contact pressure therewith.

2. The invention as defined in claim 1, wherein an end of each of said spring fingers is pointed.

3. The invention as defined in claim 1, wherein said first base includes a pair of spaced alignment holes; wherein said second base includes a pair of spaced alignment holes, said alignment holes in each said pair being spaced apart a predetermined distance; and wherein a first alignment hole in each pair is axially aligned with a corresponding first alignment hole in each of the remaining pairs of alignment holes; and wherein a second alignment hole in each pair is axially aligned with a corresponding second alignment hole in each of the remaining pairs of alignment holes.

4. The invention as defined in claim 3, wherein said fastening means further comprises:
   a first clamping bar and a second clamping bar, said first clamping bar abutting a rear surface of said first base and said second clamping bar abutting a rear surface of said second base;
   and first and second bolt means extending through said first clamping bar, through said alignment holes and into engagement with said second clamping bar.

5. An electrical cryogenic connector for cryogenic application comprising:
   a first printed circuit board of electrically insulative material having a plurality of spaced flat spring metal electrical conductors attached in parallel orientation to and protruding from a first surface of said first printed circuit board, said spaced flat spring metal electrical conductors comprising thin strips plated onto said first surface;
   said spaced flat spring metal electrical conductors on said first printed circuit board including respective end portions detached from said base and formed in a curved shaped extending outwardly from said first circuit board to define spring fingers.

6. The invention as defined in claim 5, wherein said first printed circuit board further includes a pair of spaced alignment holes; and, further comprising:
   fastening means for mechanically holding said first printed circuit board in mating engagement with another printed circuit board containing a plurality of like-spaced plated-on conductors, wherein said spring fingers respectively engage corresponding conductors on said mating circuit board and maintains positive contact pressure therewith at cryogenic temperature, said fastening means including:
   a first clamping bar and a second clamping bar;
   said first clamping bar for abutting a rear surface of said first printed circuit board and said second clamping bar for abutting a rear surface of said another printed circuit board; and
   first and second bolt means for extending through said alignment holes and joining said clamping bars.

7. The invention as defined in claim 5, wherein said spring metal consists of a Beryllium Copper alloy.

8. The invention as defined in claim 6, further comprising:
   a flex cable having an end, said flex cable containing a plurality of electrical lines arranged in parallel along a common plane sandwiched between first and second covering layers of electrical insulating material;
   said second covering layer extending to a predetermined distance of said end, leaving an end portion of said electrical lines uncovered;
   said end portion of said electrical lines overlaying portions of and being mechanically and electrically connected to corresponding ones of said spaced flat spring metal electrical conductors for providing electrical contact with said respective corresponding ones of said spaced flat spring metal electrical conductors.

9. The invention as defined in claim 8, further comprising:
   strain relief clamping means for clamping said flex cable means to said first printed circuit board, said clamping means being mounted over said flex cable means and before said end portion of said flex cable means.

10. An electrical connector for cryogenic application comprising:
    a first printed circuit board of electrically insulative material having a plurality of spaced flat spring metal electrical conductors attached in parallel orientation to and protruding from a first surface of said first printed circuit board, said spaced flat spring metal electrical conductors comprising thin strips plated onto said first surface;
    said spaced flat spring metal electrical conductors on said first printed circuit board having an end portion detached from said base and formed in a curved shaped extending outwardly from said first circuit board to define spring fingers;
    said first printed circuit board further including a pair of spaced alignment holes; and, further comprising:
    fastening means for mechanically holding said first printed circuit board in mating engagement with another printed circuit board containing a plurality of like-spaced plated-on conductors, wherein said spring fingers respectively engage corresponding conductors on said mating circuit board and maintains positive contact pressure therewith at cryogenic temperature, said fastening means including:
    a first clamping bar and a second clamping bar;
    said first clamping bar for abutting a rear surface of said first printed circuit board and said second clamping bar for abutting a rear surface of said another printed circuit board; and first and second bolt means for extending through said alignment holes and joining said clamping bars;

said electrical connector further comprising:

flex cable means having an end, said flex cable means containing a plurality of electrical lines arranged in parallel along a common plane sandwiched between first and second covering layers of electrical insulating material;

said second covering layer extending to a predetermined distance of said end, leaving an end portion of said electrical lines free of electrical insulating material;

said end portion of said electrical lines overlaying portions of and being mechanically and electrically connected to corresponding ones of said spaced flat spring metal electrical conductors for providing electrical contact with said respective corresponding ones of said spaced flat spring metal electrical conductors;

strain relief clamping means for clamping said flex cable means to said first printed circuit board, said clamping means being mounted over said flex cable means and before said end portion of said flex cable means;

said first printed circuit board including first and second strain relief bolt passages, said first and second strain relief bolt passages being spaced apart; and wherein said strain relief clamping means further comprises:

a first strain relief clamping bar and a second strain relief clamping bar; said first strain relief clamping bar including a pair of bolt passages, said bolt passages being spaced apart the same distance as said first and second strain relief bolt passages; said second strain relief clamping bar including a pair of threaded bolt holes, said bolt holes being spaced apart the same distance as said first and second strain relief bolt passages;

said first strain relief clamping bar for abutting said flex cable means and said second strain relief clamping bar for abutting a rear surface of said first printed circuit board;

first strain relief bolt means for extending through one of said pair of bolt passages in said first strain relief clamping bar, said first strain relief bolt passage, and into threaded engagement with one of said pair of threaded bolt holes; and second strain relief bolt means for extending through another one of said pair of bolt passages in said first strain relief clamping bar, said second strain relief bolt passage, and into threaded engagement with another one of said pair of threaded bolt holes.

11. An electrical connector for cryogenic application comprising:

a first printed circuit board of electrical insulator material having a plurality of spaced Beryllium Copper conductors attached in parallel orientation to and protruding from a first surface of said first printed circuit board, said spaced Beryllium Copper conductors comprising thin strips plated onto said first surface;

said spaced Beryllium Copper conductors on said first printed circuit board having a pointed end portion detached from said base and formed in a curved shaped extending outwardly from said first circuit board to define spring fingers;

said first printed circuit board further including a pair of spaced alignment holes;

a second printed circuit board of electrical insulator material having a plurality of spaced metal conductors attached in parallel to and protruding from a first surface of said second printed circuit board;

said second printed circuit board further including a pair of alignment holes spaced apart by the same distance as said pair of alignment holes in said first printed circuit board;

said plurality of spaced metal conductors of said second printed circuit board being spaced apart by the same spacing existing between said plurality of Beryllium Copper conductors on said first printed circuit board;

said first printed circuit board being oriented with said plurality of Beryllium Copper conductors directly facing and aligned with respective ones of said plurality of metal conductors on said second printed circuit board;

clamping means for mechanically pressing said first printed circuit board against said second printed circuit board wherein said spring fingers of said first printed circuit board respectively engage and compress against corresponding metal conductors on said second circuit board and maintains positive contact pressure on said corresponding metal conductors at cryogenic temperature, said clamping means including:

a first clamping bar and a second clamping bar;

said first clamping bar for abutting a rear surface of said first printed circuit board and said second clamping bar for abutting a rear surface of said second printed circuit board; and first and second bolt means for extending through said alignment holes and joining said clamping bars;

flex cable means having an end, said flex cable means containing a plurality of electrical lines arranged in parallel along a common plane sandwiched between first and second covering layers of electrical insulating material;

said second covering layer extending to a predetermined distance of said end, leaving an end portion of said electrical lines uncovered;

said end portion of said electrical lines overlaying portions of and being mechanically and electrically connected to corresponding ones of said spaced metal conductors on said second printed circuit board for providing electrical contact with said respective corresponding ones of said spaced metal conductors of said second printed circuit board;

said second printed circuit board further including first and second strain relief bolt passages, said first and second strain relief bolt passages being spaced apart;

strain relief clamping means for clamping said flex cable to said second printed circuit board, said clamping means being mounted over said flex cable means and before said end portion of said flex cable means;

said strain relief clamping means comprising:

a first strain relief clamping bar and a second strain relief clamping bar; said first strain relief clamping bar including a pair of bolt passages, said bolt passages being spaced apart the same distance as said first and second strain relief bolt passages; said second strain relief clamping bar including a pair of threaded bolt holes, said bolt holes being spaced apart the same distance as said first and second strain relief bolt passages;

said first strain relief clamping bar for abutting said flex cable and said second strain relief clamping bar for abutting a rear surface of said second printed circuit board;

first strain relief bolt means for extending through one of said pair of bolt passages in said first strain relief clamping bar, said first strain relief bolt passage, and into threaded engagement with one of said pair of threaded bolt holes; and second strain relief bolt means for extending through another one of said pair of bolt passages in said first strain relief clamping bar, said second strain relief bolt passage, and into threaded engagement with another one of said pair of threaded bolt holes.

* * * * *